(12) United States Patent  
Anderson et al.

(10) Patent No.: US 8,796,057 B2  
(45) Date of Patent: Aug. 5, 2014

(54) ISOLATION STRUCTURES FOR GLOBAL SHUTTER IMAGER PIXEL, METHODS OF MANUFACTURE AND DESIGN STRUCTURES

(71) Applicant: International Business Machines Corporation, Armonk, NY (US)

(72) Inventors: Brent A. Anderson, Jericho, VT (US); Mark D. Jaffe, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/766,952

(22) Filed: Feb. 14, 2013

(65) Prior Publication Data

US 2013/0164877 A1    Jun. 27, 2013

Related U.S. Application Data

(62) Division of application No. 12/897,230, filed on Oct. 4, 2010, now Pat. No. 8,507,962.

(51) Int. Cl.  
*H01L 21/00* (2006.01)

(52) U.S. Cl.  
USPC .............................. 438/48; 438/196; 257/292

(58) Field of Classification Search  
CPC ... H01L 31/1133; H01L 27/146; H01L 31/00; H01L 31/02024; H01L 31/0203; H01L 27/14603; H01L 27/14616; H01L 27/14689  
USPC ........ 438/48–60, 196, 207; 257/72, 291, 292, 257/293, 294, 431, 458, 462, 463, E31.001, 257/E31.073, E27.133, E31.079, E31.032, 257/E31.011  
See application file for complete search history.

(56) References Cited

U.S. PATENT DOCUMENTS

| 7,187,017 | B2  | 3/2007  | Sawase et al. |
| 7,187,917 | B2  | 3/2007  | Lin et al. |
| 7,205,627 | B2  | 4/2007  | Adkisson et al. |
| 7,279,770 | B2  | 10/2007 | Mouli |
| 7,307,327 | B2  | 12/2007 | Bahl et al. |
| 7,492,027 | B2  | 2/2009  | Mouli |
| 7,518,172 | B2  | 4/2009  | Moon et al. |
| 7,608,872 | B2  | 10/2009 | Kim |
| 7,659,564 | B2  | 2/2010  | Adkisson et al. |
| 2005/0184291 | A1* | 8/2005 | Cole et al. ........................ 257/59 |
| 2005/0184353 | A1* | 8/2005 | Mouli ........................... 257/446 |
| 2006/0180885 | A1  | 8/2006  | Rhodes |

(Continued)

OTHER PUBLICATIONS

Notice of Allowance for related U.S. Appl. No. 12/897,230 dated Apr. 10, 2013.

(Continued)

*Primary Examiner* — Khiem D Nguyen  
(74) *Attorney, Agent, or Firm* — Anthony Canale; Roberts Mlotkowski Safran & Cole, P.C.

(57) ABSTRACT

Pixel sensor cells, e.g., CMOS optical imagers, methods of manufacturing and design structures are provided with isolation structures that prevent carrier drift to diffusion regions. The pixel sensor cell includes a photosensitive region and a gate adjacent to the photosensitive region. The pixel sensor cell further includes a diffusion region adjacent to the gate. The pixel sensor cell further includes an isolation region located below a channel region of the gate and about the photosensitive region, which prevents electrons collected in the photosensitive region to drift to the diffusion region.

11 Claims, 7 Drawing Sheets

(56) References Cited

U.S. PATENT DOCUMENTS

| | | | |
|---|---|---|---|
| 2007/0102738 A1* | 5/2007 | Adkisson et al. | 257/292 |
| 2007/0145444 A1* | 6/2007 | Lim | 257/292 |
| 2007/0187734 A1 | 8/2007 | Adkisson et al. | |
| 2007/0235792 A1* | 10/2007 | Kwon et al. | 257/314 |
| 2008/0164500 A1* | 7/2008 | Shinohara et al. | 257/292 |
| 2008/0237450 A1 | 10/2008 | Abadeer | |
| 2008/0265348 A1 | 10/2008 | Maas et al. | |
| 2010/0002108 A1 | 1/2010 | Mabuchi | |
| 2010/0127313 A1* | 5/2010 | Lee | 257/292 |

OTHER PUBLICATIONS

Park et al., "Deep Trench Isolation for Crosstalk Suppression in . . . Pixel Pitch", Japanese Journal of Applied Physics, vol. 46, No. 4B, 2007, pp. 2454-2457.

Fossum et al. "CMOS Image Sensors:Electronic Camera-On-A-Chip", IEEE Transactions on Electron Devices, vol. 44, No. 10, Oct. 1997, pp. 1689-1698.

* cited by examiner

ISOLATION STRUCTURES FOR GLOBAL SHUTTER IMAGER PIXEL, METHODS OF MANUFACTURE AND DESIGN STRUCTURES

FIELD OF THE INVENTION

The invention relates to pixel sensor cells and methods of manufacturing and, more particularly, pixel sensor cells, e.g., CMOS optical imagers, with isolation structures that prevent carrier drift to diffusion regions, methods of manufacturing and design structures.

BACKGROUND

An image sensor is a device that converts an optical image to an electric signal. It is used mostly in digital cameras and other imaging devices. Current image sensors are typically, for example, a charge-coupled device (CCD) or a complementary metal-oxide-semiconductor (CMOS) active-pixel sensor cell. In a CMOS active-pixel sensor cell, circuitry is needed next to each photo sensor (diode) to convert the light energy to a voltage. Additional circuitry on the chip is also included to convert the voltage to digital data. The circuitry receives power from Vdd through a switched rail line Vdd.

In many applications, though, electrons on the photodiode have a tendency to drift, reaching other structures on the cell. For example, electrons can drift to the floating diffusion, which can degrade the picture quality. Picture quality degradation due to carrier drift from the photo diode to other parts of the cell is especially important in global shutter mode imaging. Electron shielding, though, is a difficult challenge, since total shielding efficiencies may be needed on the order of 3,000,000 to one.

Accordingly, there exists a need in the art to overcome the deficiencies and limitations described hereinabove.

SUMMARY

In a first aspect of the invention, a pixel sensor cell comprises a photosensitive region. The pixel sensor cell further comprises a gate adjacent to the photosensitive region. The pixel sensor cell further comprises a diffusion region adjacent to the gate. The pixel sensor cell further comprises an isolation region located below a channel region of the gate and about the photosensitive region, which prevents electrons collected in the photosensitive region to drift to the diffusion region.

In another aspect of the invention, a method of forming a pixel sensor cell comprises forming a deep trench isolation structure in a substrate. The method further comprises forming a buried deep trench isolation structure in the substrate. The method further comprises forming a channel region over the buried deep trench isolation structure. The method further comprises forming a photosensitive region within a perimeter formed by the deep trench isolation structure and the buried deep trench isolation structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the pixel sensor cell (PCS), which comprises the structures of the present invention. In still further embodiments, a method in a computer-aided design system is provided for generating a functional design model of the PCS. The method comprises generating a functional representation of the structural elements of the PCS.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to pixel sensor cells and methods of manufacturing and, more particularly, pixel sensor cells, e.g., CMOS optical imagers, with isolation structures that prevent electrons which are collected in the photo diode due to a direct incidence of light on the silicon from drifting to the floating diffusion which stores the charge for read out, and methods of manufacturing and designing such structures. In embodiments, the present invention provides isolation structures around a photodiode of the pixel sensor cell in order to prevent drifting electrons from entering a diffusion region and hence improves the image quality which would otherwise be degraded due to the carrier drift. Advantageously, the isolation structures provide electron shielding, while also being configured to provide a transistor channel region to allow transfer of electrons from the photodiode to a transfer gate, for example. The invention is described in regards to carriers being electrons but that it also applies to an opposite polarity device where the carriers are holes.

Figure 1:
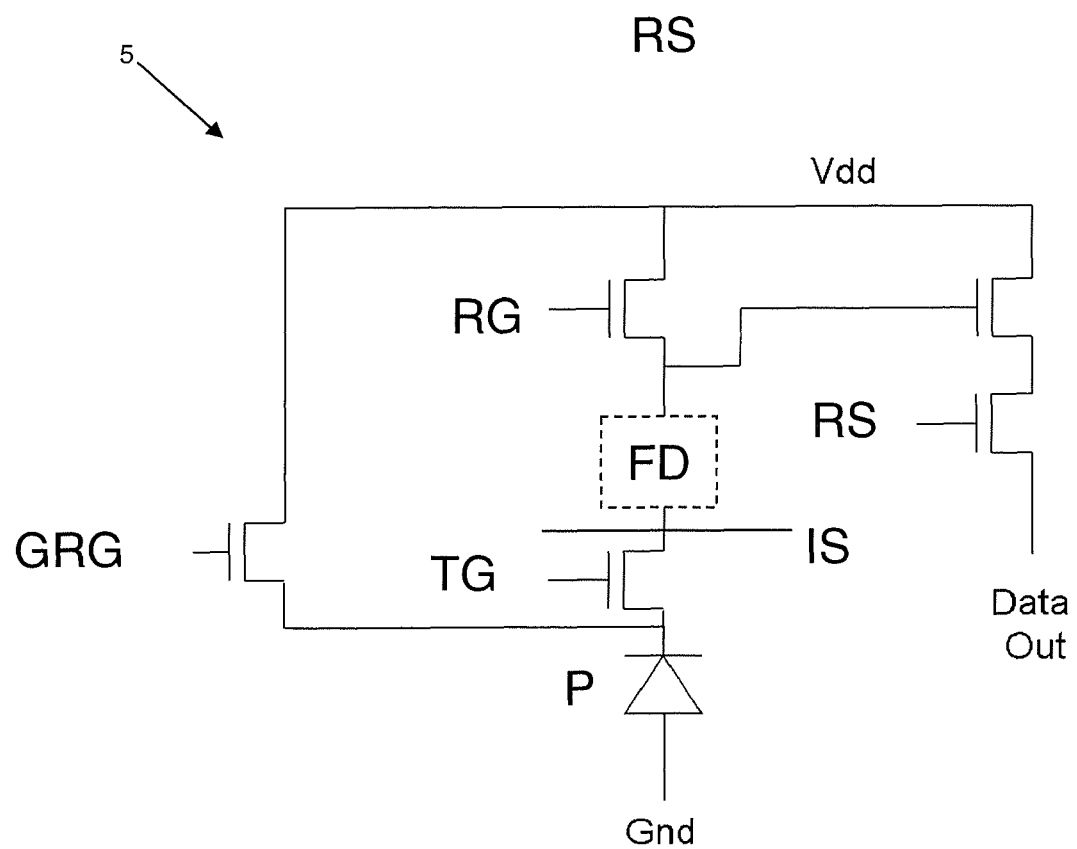
FIG. 1 shows an exemplary circuit of a pixel sensor cell implemented in accordance with aspects of the present invention.

FIG. 1 shows an exemplary overview circuit of a pixel sensor cell implemented in accordance with aspects of the present invention. The pixel sensor cell 5 (e.g., image sensor cell, CMOS sensor cell, etc.) includes a global reset gate GRG, transfer gate TG and reset gate RG, connected between Vdd and ground, Gnd. The pixel sensor cell 5 further includes a floating diffusion FD between the transfer gate TG and reset gate RG. A row select RS is also connected between Vdd and data out. An isolation structure IS prevents electrons from floating into the floating diffusion FD, from a photodiode P.

Figure 2:
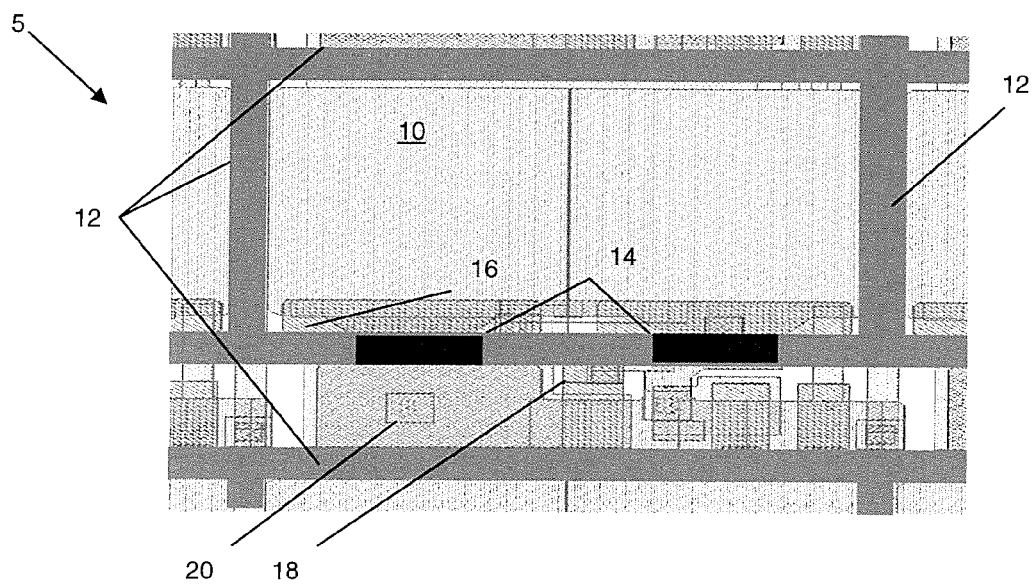
FIG. 2 shows a top view of a pixel sensor cell in accordance with aspects of the present invention.

FIG. 2 shows a top view of a pixel sensor cell in accordance with aspects of the present invention. The pixel sensor cell 5 includes a photodiode 10 which is isolated from other structures of the pixel sensor cell 5 by a deep trench isolation structure 12 and a buried deep trench isolation structure 14. In embodiments, the photodiode (photosensitive region) 10 can be a pinned photodiode (PPD).

More specifically, the deep trench isolation structure 12 and the buried deep trench isolation structure 14 surround a perimeter of the photodiode 10, which effectively creates a diffusion shield around the perimeter of the photodiode 10. This diffusion shield effectively prevents electrons from drifting into the floating diffusion or other structures of the pixel sensor cell 5 and degrading image quality. In addition, the buried deep trench isolation structure 14 seals off electron transfer under a transfer gate while still allowing transfer of charge collected in the photodiode 10 through the transfer gate 16 into the floating diffusion 20.

In embodiments, the deep trench isolation structure 12 and the buried deep trench isolation structure 14 isolate the photodiode 10 from a transfer gate 16, and floating diffusion region generally denoted as reference numeral 20, amongst other features. In embodiments, the deep trench isolation structure 12 and the buried deep trench isolation structure 14 extend into the underlying P+ substrate, for example, and will prevent electrons from drifting into the other structures of the pixel sensor cell 5. In further embodiments, the depth of the deep trench isolation structure 12 and the buried deep trench isolation structure 14 can be about 5 to 12 microns; although other dimensions are also contemplated by the present invention depending on the thickness of an upper P-epi layer (as described in more detail below). For example, the deep trench isolation structure 12 and the buried deep trench isolation structure 14 can be a depth equal to about a deepest depth into the P+ substrate that carriers generated in the photodiode 10 may be present. In addition, to isolate under the transfer gate 16, the buried deep trench isolation structure 14 is formed with silicon on top of high enough quality to form a transistor channel region.

Figure 3:
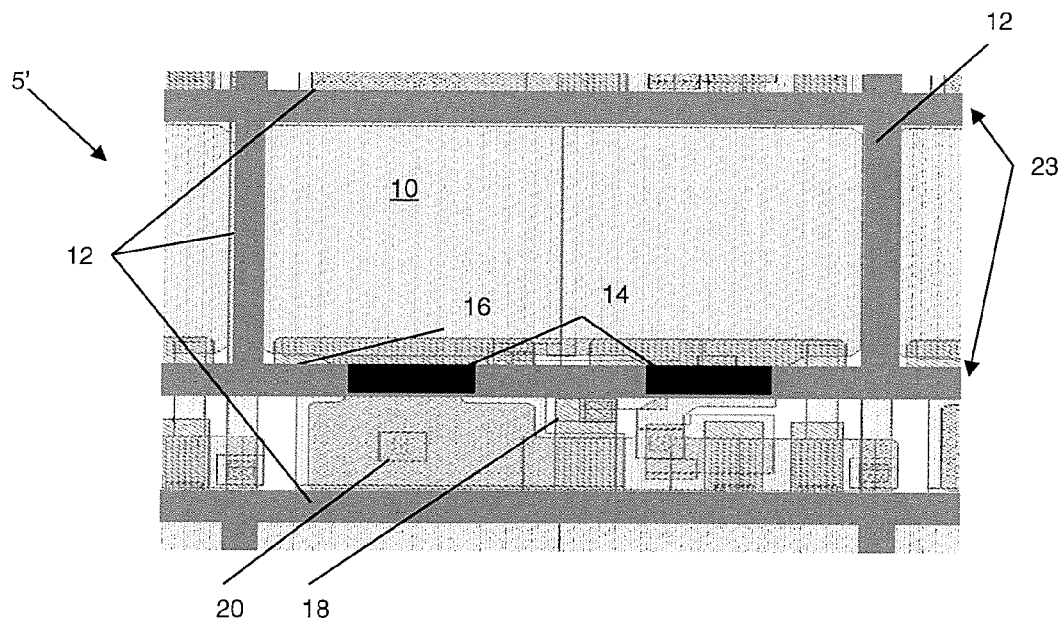
FIG. 3 shows a top view of a pixel sensor cell in accordance with additional aspects of the present invention.

FIG. 3 shows a top view of a pixel sensor cell in accordance with additional aspects of the present invention. The pixel sensor cell 5' (e.g., image sensor cell, CMOS sensor cell, etc.) includes a light shield 23 around the photodiode 10, which is isolated from other structures by the deep trench isolation structure 12 and the buried deep trench isolation structure 14. The shield 23 should allow photons (light) to hit the photodiode 10.

In embodiments, the shield 23 is a metal shield that is provided over many of the structures of the pixel sensor cell 5'. In embodiments, the shield 23 is formed over portions of the deep trench isolation structure 12 and buried deep trench isolation structure 14, as well as the transfer gate 16, reset (global reset) gate 18 and the floating diffusion region 20, amongst other features. The shield 23, in embodiments, will prevent photons (e.g., light) from directly hitting the structures, e.g., transfer gate 16, global reset gate 18 and, in particular, the floating diffusion region 20.

Figure 4:
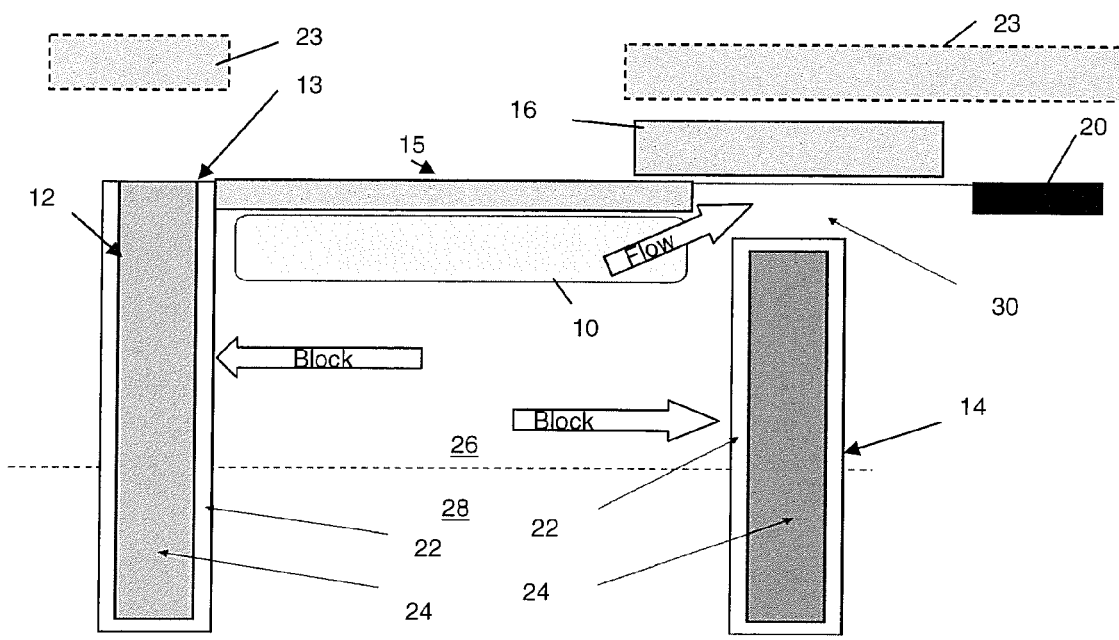
FIG. 4 shows a cross sectional view of the pixel sensor cell in accordance with aspects of the invention.

FIG. 4 shows a cross sectional view of the pixel sensor cell in accordance with aspects of the invention. The pixel sensor cell of FIG. 4 can be representative of the pixel sensor cell 5 or 5' of either FIG. 2 or FIG. 3. In embodiments, the deep trench isolation structure 12 and the buried deep trench isolation structure 14 each include a dielectric material 22, lined within the trench. The dielectric layer 22 can be, for example, oxide or nitride, and may be about 200 Angstroms in thickness. A conductive material 24 such as, for example, doped polysilicon, fills the remaining portion of the trench. The conductive material 24 can be biased to accumulate surface for low dark current. Also, portions of the conductive material 24 of the buried deep trench isolation structure 14 (under the transfer gate 16 or other gate, e.g., global reset gate) can be biased to back gate the channel of the transistor 30 to help turn the transfer gate on and off.

As further shown in FIG. 4, the deep trench isolation structure 12 and the buried deep trench isolation structure 14 extend into a P-epi substrate 26 and a P+ substrate 28, to form a physical barrier. The P-epi substrate can be about 3 microns to about 10 microns, and more preferably about 5 microns. In embodiments, the deep trench isolation structure 12 and the buried deep trench isolation structure 14 extend into the P+ substrate 28; although, in other embodiments, the deep trench isolation structure 12 and the buried deep trench isolation structure 14 can stop at the P+ substrate 28. In embodiments, the deep trench isolation structure 12 and the buried deep trench isolation structure 14 are about 5 microns to 12 microns in depth and, more preferably about 7 microns to 10 microns. In embodiments, the deep trench isolation structure 12 and the buried deep trench isolation structure 14 can be a depth equal to about a deepest depth into the P+ substrate that carriers generated in the photodiode 10 may be present.

As further shown in FIG. 4, a silicon layer 30 is provided on top of the buried deep trench isolation structure 14 and below the transfer gate 16 (or other gate, e.g., global reset gate). As in any of the embodiments, the buried deep trench isolation structure 14 can also be under a channel region of a global reset gate within the same pixel. The silicon layer 30 can range in thickness and, in embodiments, is about 0.1 micron to about 0.3 microns. The silicon layer 30 provides a transistor channel region to allow electrons to be transferred from the photodiode 10. When the transfer gate 16 is turned on, charge from the photo diode 10 can be transferred to the floating diffusion 20.

Also, as shown, the deep trench isolation structure 12 extends to a surface 13 of the structure, with the photodiode 10 bordered by the deep trench isolation structure 12 and the buried deep trench isolation structure 14. The photodiode 10 is formed within the P-epi substrate 26. On top of the photo diode 10 is a surface pinning layer 15. The arrows in FIG. 4 represent electrons being blocked by the deep trench isolation structure 12 and the buried deep trench isolation structure 14, as well as flowing into the channel region, denoted by reference numeral 30. The metal shield 23 can also be formed over the structure and, more particularly, over the transfer gate 16, deep trench isolation structure 12 and the buried deep trench isolation structure 14, as shown in dashed lines to represent this option. The shield 23 should allow photons (light) to hit the photodiode 10.

As further discussed below, and as should be understood by those of skill in the art, many of the processing steps for manufacturing the deep trench isolation structure 12 and buried deep trench isolation structure 14 (in any of the aspects of the present invention) can be processed during same fabrication steps such as, for example, trench build and trench fill with dielectric material and conductive material. This will minimize masking steps and other fabrication costs.

Figure 5:
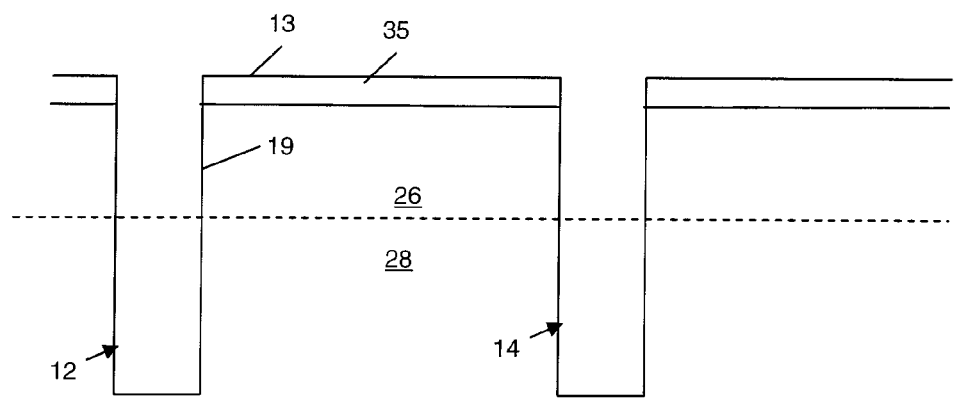
FIGS. 5-8 show various processing steps and respective structures of the pixel sensor cell of FIG. 2 or FIG. 3, in accordance with aspects of the present invention.

FIGS. 5-8 show various processing steps and respective structures representative of the pixel sensor cell of FIG. 2 or FIG. 3, for example, in accordance with aspects of the present invention. More specifically, FIG. 5 shows trenches 19 formed in the P-epi substrate 26 and P+ substrate 28. The trenches 19 can be representative of the formation of both the deep trench isolation structure 12 and the buried deep trench isolation structure 14. The trenches 19 can be formed by conventional lithographic and etching processes, known to those of skill in the art. For example, a resist (not shown) can be formed on the surface 13 of the P-epi substrate 26. The resist can be exposed to light to form a pattern (openings). A reactive ion etch (RIE) is then performed to form the trenches 19. The resist can then be stripped. FIG. 5 also shows surface films generally represented at reference numeral 35.

Figure 6:
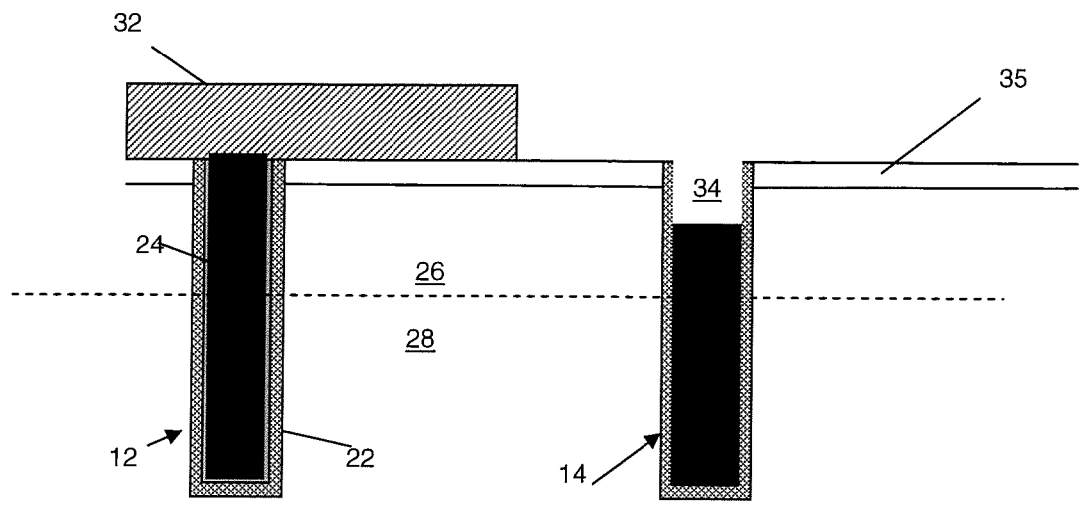

In FIG. 6, sidewall insulators 22 are formed in the trenches 19. In embodiments, the sidewalls 22 can be a dielectric material such as, for example, an oxide formed by a growing process. In embodiments, other dielectric materials such as, for example, silicon nitride, can be formed on the walls of the trenches 19. The trenches 19 are then filled with a conductive material 24 such as, for example, a doped poly material. The conductive material 24 can be polished using conventional polishing processes such as, for example, a chemical mechanical polish (CMP). In embodiments, a mask 32 is formed on the trench that will be used as the deep trench isolation structure 12, and the conductive material 24 in the trench that will form the buried deep trench isolation structure 14 will undergo a recess etch to form a recess 34. In embodiments, the sidewalls 22 can also be recessed. The surface films 35 prevent the surface from being etched during formation of recess.

Figure 7:
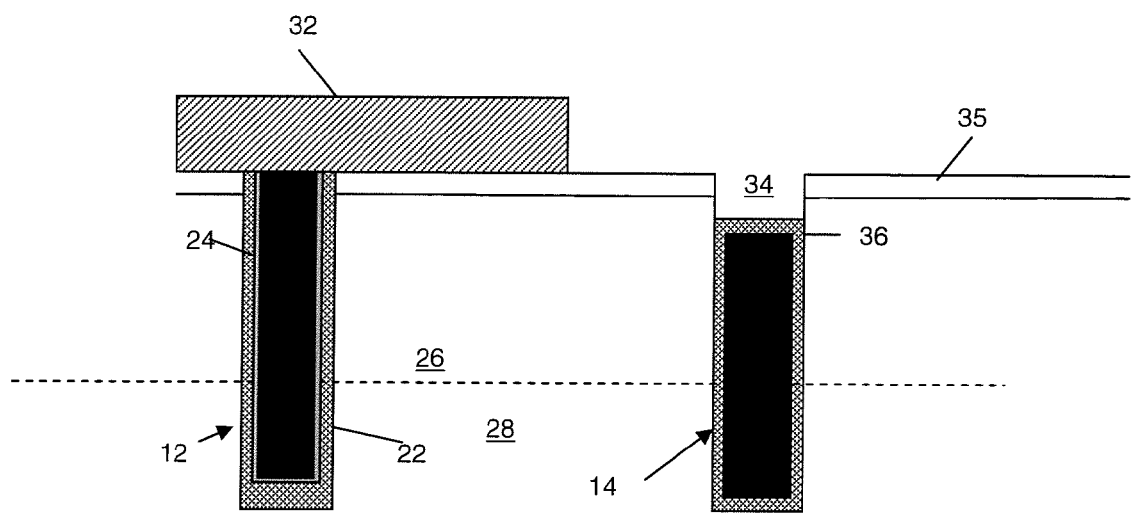

In FIG. 7, a cap material is provided in the recess 34, on the conductive material 24. The cap material can be, for example, oxide or other dielectric material. In embodiments, the cap material is deposited using a conventional chemical vapor deposition (CVD) process. The dielectric material is recessed by, for example, a wet etch process, to form the cap layer 36. The wet etch process will also remove any sidewall material that was left in the recess 34. The resulting cap layer 36 can be, for example, about 100 Å to 200 Å. The mask 32 and layer 35 are removed after the recess is formed.

Figure 8:
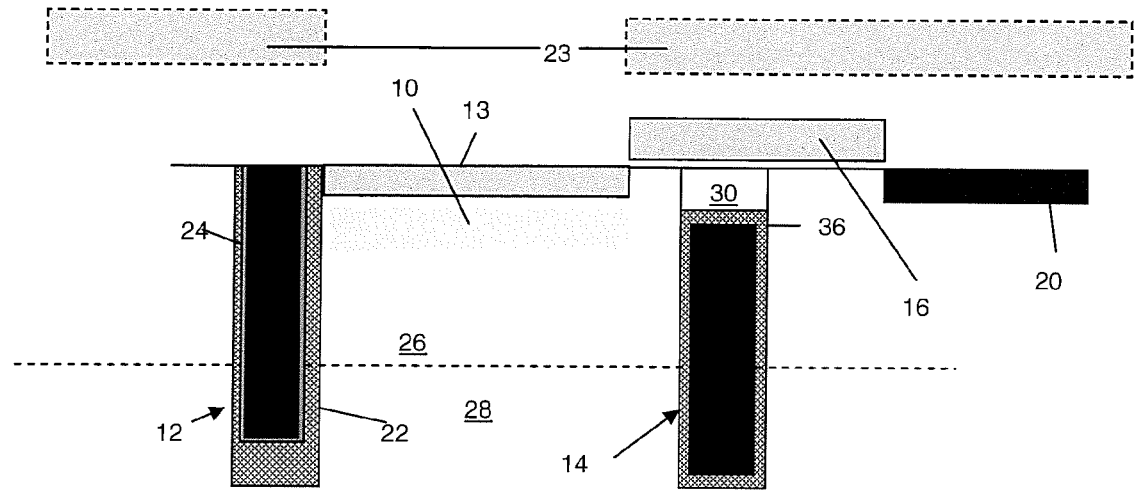

In FIG. 8, a silicon material fills the recess by, for example, using an epi overgrowth. In embodiments, the silicon material is then polished using, for example, a conventional CMP process, to form the channel region 30. The polishing will planarize the channel region (silicon material) 30, to be planar with the surface 13. In this way, the buried deep trench isolation structure 14 can be under a channel region of a gate, e.g., a transfer gate and/or global reset gate within the same pixel.

Other structures can be formed in a conventional CMOS process. For example, the photodiode 10 can be formed by an implantation process, and the gates (e.g., transfer gate 16) can be formed by conventional deposition and etching processes to form, for example, a gate structure with a poly gate and underlying dielectric material (e.g., oxide, hafnium oxide, etc.). The wiring layer 21 can be formed by a conventional deposition process such that no further explanation is required.

Figure 9:
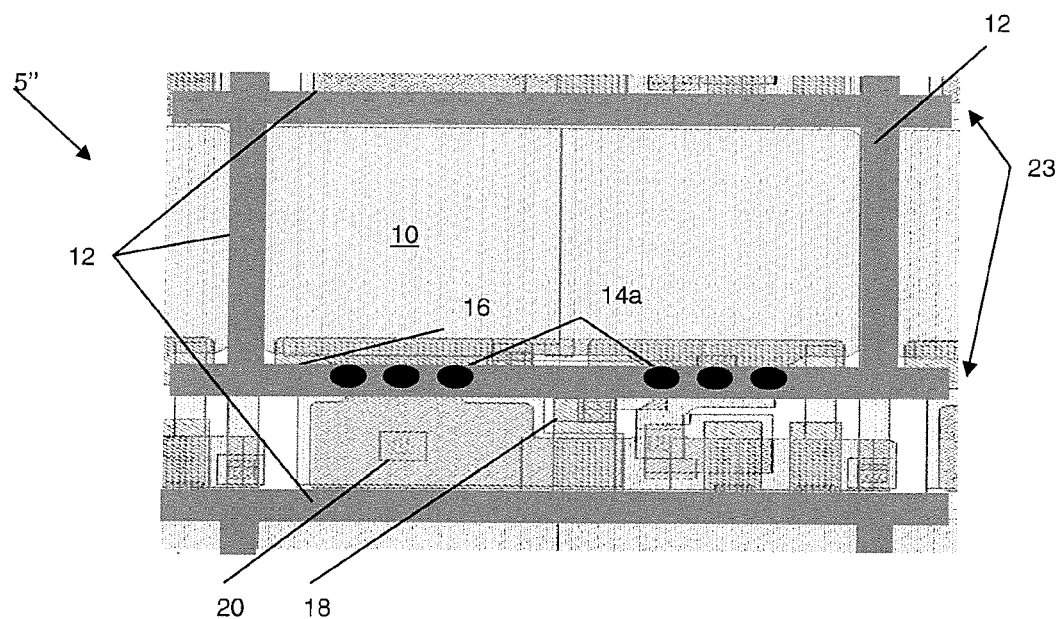
FIG. 9 shows a top view of a pixel sensor cell in accordance with aspects of the present invention.

FIG. 9 shows a top view of a pixel sensor cell in accordance with aspects of the present invention. The pixel sensor cell 5" (e.g., image sensor cell, CMOS sensor cell, etc.) includes a photodiode (photosensitive region) 10 which is isolated from other structures of the pixel sensor cell 5" by a deep trench isolation structure 12 and a buried deep trench isolation structure 14a. The photodiode (photosensitive region) 10 can be a PPD. In embodiments, the buried deep trench isolation structure 14a includes, for example, a plurality of closely spaced trenches, as described in more detail herein.

As in the previous aspects of the invention, the deep trench isolation structure 12 and the buried deep trench isolation structure 14a surround a perimeter of the photodiode 10, which effectively creates a diffusion shield around the perimeter of the photodiode 10. This diffusion shield effectively prevents electrons from drifting into the floating diffusion or other structures of the pixel sensor cell 5". In addition, the buried deep trench isolation structure 14 seals off electron transfer under a transfer gate while still allowing transfer of charge collected in the photodiode 10 to the floating diffusion 20 when the transfer gate 16 is turned on.

In embodiments, the deep trench isolation structure 12 and the buried deep trench isolation structure 14a isolate the photodiode 10 from the transfer gate 16, reset gate 18 and floating diffusion region 20, amongst other features. In embodiments, the deep trench isolation structure 12 and the buried deep trench isolation structure 14a extend into the underlying P+ substrate, for example, and will prevent electrons from floating into the other structures of the pixel sensor cell 5". In further embodiments, the depth of the deep trench isolation structure 12 and the buried deep trench isolation structure 14a can be about 5 to 12 microns; although other dimensions are also contemplated by the present invention depending on the thickness of an upper P-epi layer (as described in more detail below). For example, as described above, the deep trench isolation structure 12 and the buried deep trench isolation structure 14a can be a depth equal to about a deepest depth into the P+ substrate that carriers generated in the photodiode 10 may be present. In addition, to isolate under the transfer gate 16, the buried deep trench isolation structure 14a is formed with silicon on top of high enough quality to form a transistor channel region.

Figure 10:
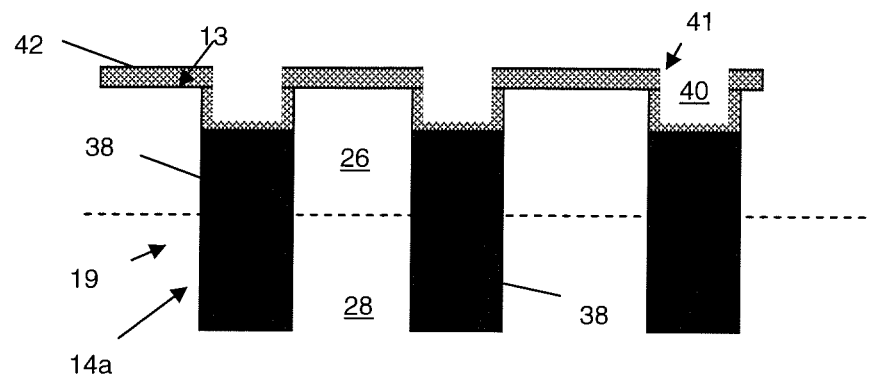
FIGS. 10-12 show various processing steps and respective structures of the pixel sensor cell of FIG. 9, in accordance with aspects of the present invention.
Figure 11:
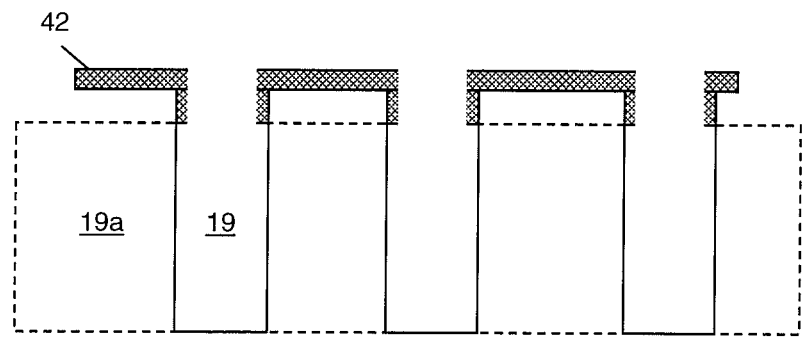
Figure 12:
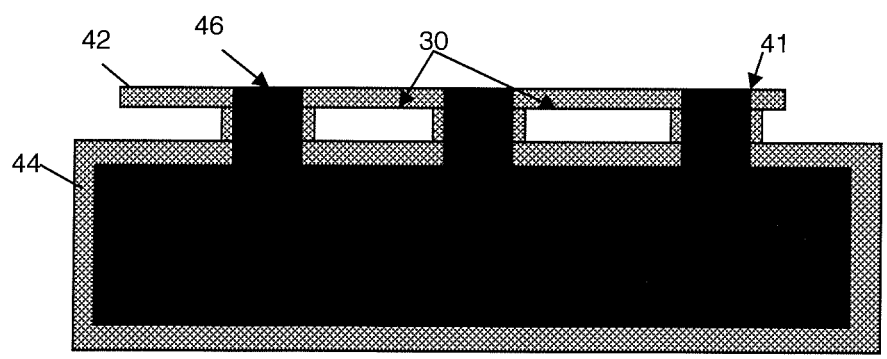

FIGS. 10-12 show various processing steps and respective structures in accordance with aspects of the present invention (for building the buried deep trench isolation structure 14a). More specifically, FIG. 10 shows trenches 19 formed in the P-epi substrate 26 and P+ substrate 28. The trenches 19 can be representative of the formation of the buried deep trench isolation structure 14a. In embodiments, the deep trench isolation structure 12 is formed by the processes described above. The trenches 19 can be closely spaced trenches formed by conventional lithographic and etching processes, known to those of skill in the art. For example, a resist (not shown) can be formed on the surface 13 of the P-epi substrate 26. The resist can be exposed to light to form a pattern (openings). A reactive ion etch (RIE) is then performed to form the trenches 19. The resist can then be stripped. In embodiments, the spacing between the trenches 19 can range from about 0.1 micron to about 0.2 microns; although other dimensions that allowing joining of the trenches during a subsequent etching process are also contemplated by the present invention.

As further shown in FIG. 10, the trenches 19 are filled with removable material 38. The removable material 38 can be, for example, photoresist. A recess 40 is provided in the trenches 19 by recessing the removable material 38 using, for example, a conventional etching or developing process. The recesses 40 can be about 0.1 micron to about 0.3 microns in depth; although other dimensions are also contemplated by the present invention. Into the recesses 40, a dielectric material, for example an oxide is deposited forming collars 41 in the trench tops. In embodiments, the depth of the recess 40 should be deeper than the distance between the trenches, 19, so that a subsequent etch does not come up to the surface. During these processing steps, the deep trench isolation structure 12 can be masked. In embodiments, the dielectric material 42 can be any dielectric material such as, for example, an oxide formed by a growing process. In embodiments, other dielectric materials such as, for example, nitride, is also contemplated by the present invention. The dielectric material 42 can be, for example, about 100 Å to 200 Å.

In FIG. 11, the removable dielectric material 42 (on the removable material 38) is removed using conventional spacer etching processes. The removable material 38 is then removed. This process results in portions of the dielectric material 42 remaining on sidewalls of the trenches 19 (in the recess area). The trenches are then enlarged by a wet etching process to join the trenches into a single trench 19a, as represented by the dashed line. During the wet etching, the deep recesses do not allow the wet etch to come up to the surface, thereby ensuring the creation of a channel region.

As shown in FIG. 12, the trench 19a is then lined with a sidewall material 44. The sidewall material 44 can be a dielectric such as, for example, an oxide material. A fill material such as, for example, a conductive material 46 is then provided in the trench 19a (and the previously formed recesses). The conductive material 44 can be, for example, a doped poly material. The conductive material 24 can be polished using conventional polishing processes such as, for example, a chemical mechanical polish (CMP). In embodiments, the spaces between the conductive material 24 (e.g., spaces between the collars) are channel regions 30 comprising the substrate. As discussed above, the conductive material 46 can be biased.

The photodiode 10 and other components (including the optional shield) can then be formed using conventional processes noted above. For example, the photodiode is formed by an implantation process, and the gates (e.g., transfer gate 16) can be formed by conventional deposition and etching processes to form, for example, a gate structure with a poly gate and underlying dielectric material (e.g., oxide, hafnium oxide, etc.). The wiring layer can be formed by a conventional deposition process such that no further explanation is required.

Figure 13:
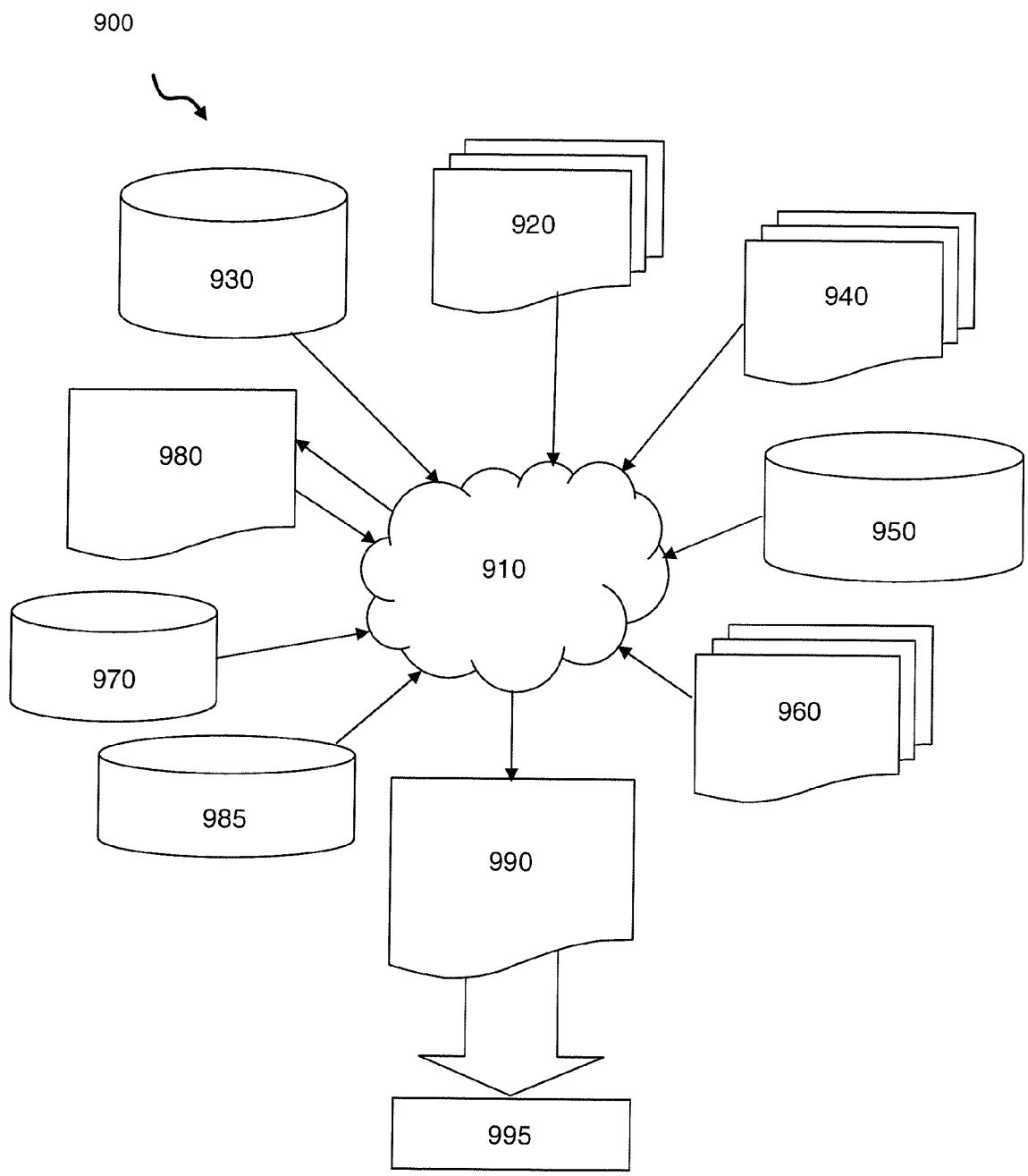
FIG. 13 is a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-12. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-12. In one embodiment, design structure 990 may comprise a compiled, executable HDL simulation model that functionally simulates the devices shown in FIGS. 1-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-12. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product or (b) an end product. The end product can be any product that includes integrated circuit chips, ranging from toys and other low-end applications to advanced cameras.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a pixel sensor cell, comprising:
    forming a deep trench isolation structure in a substrate;
    forming a buried deep trench isolation structure in the substrate;
    forming a channel region over the buried deep trench isolation structure;
    forming a photosensitive region within a perimeter formed by the deep trench isolation structure and the buried deep trench isolation structure; and
    forming gates outside the perimeter,
    wherein:
        the deep trench isolation structure and the buried deep trench isolation structure form a diffusion shield surrounding an entire perimeter of a photodiode that includes the photosensitive region;
        the forming the deep trench isolation structure comprises:
            etching into the substrate to form a trench of the deep trench isolation structure;
            lining the trench of the deep trench isolation structure with an insulator; and
            filling the trench of the deep trench isolation structure with a conductive material;
        the forming of the buried deep trench isolation structure comprises:
            etching into the substrate to form a trench of the buried deep trench isolation structure;
            lining the trench of the buried deep trench isolation structure with the insulator;
            filling the trench of the buried deep trench isolation structure with the conductive material;
            forming a recess in the trench of the buried deep trench isolation structure by etching the conductive material in the trench of the buried deep trench isolation structure;
            removing the insulator in the recess; and
            capping exposed portions of the conductive material with a capping mask;
        the capping the exposed portions of the conductive material comprises forming a capping layer in the recess and directly on the exposed portions of the conductive material; and the forming the channel region over the buried deep trench isolation structure comprises forming a silicon material in the recess and directly on the capping layer.

2. The method of claim 1, wherein the channel region is formed over the capping mask by growing Si material.

3. The method of claim 1, further comprising forming a light shield over the gates and at least portions of the deep trench isolation structure and the buried deep trench isolation structure in the substrate.

4. The method of claim 1, wherein the buried deep trench isolation structure is formed below the channel region of the gates and about the photosensitive region.

5. The method of claim 4, wherein the lining the trench of the buried deep trench isolation structure comprises lining the trench of the buried deep trench isolation structure with an insulator liner material on sidewalls thereof.

6. The method of claim 5, wherein the filing the trench of the buried deep trench isolation structure comprises forming the conductive material within the trench of the buried deep trench isolation structure over the insulator liner material.

7. The method of claim 6, wherein the capping the exposed portions of the conductive material comprises capping the conductive material with an insulator material and growing material over the capping insulator layer.

8. The method of claim 6, wherein the capping insulator layer is between the channel region and the conductive material.

9. A method of forming a pixel sensor cell, comprising:
forming a deep trench isolation structure in a substrate;
forming a buried deep trench isolation structure in the substrate;
forming a channel region over the buried deep trench isolation structure;
forming a photosensitive region within a perimeter formed by the deep trench isolation structure and the buried deep trench isolation structure; and
forming gates outside the perimeter,
wherein the forming the deep trench isolation structure comprises etching into the substrate to form a trench, lining the trench with an insulator and filling the trench with a conductive material; and
wherein the forming of the buried deep trench isolation structure comprises:
etching into the substrate to form a plurality of trenches;
filling the plurality of trenches with a removable fill material;
lining remaining portions of the trench over the removable filling material and on sidewalls with an insulator;
etching the removable fill material within the plurality of trenches until the plurality of trenches are formed into a single trench under the substrate, with collars extending to a surface of the substrate;
lining the single trench with additional insulator material; and
filling the single trench including the collars with the conductive material.

10. The method of claim 9, wherein the channel region is formed between spaces between the collars.

11. A method of forming a pixel sensor cell, comprising:
forming a deep trench isolation structure in a substrate;
forming a buried deep trench isolation structure in the substrate;
lining the buried deep trench isolation structure with an insulator liner material on sidewalls thereof;
forming conductive material within the buried deep trench isolation structure over the liner material;
forming a channel region over the buried deep trench isolation structure;
forming a photosensitive region within a perimeter formed by the deep trench isolation structure and the buried deep trench isolation structure; and
forming gates outside the perimeter,
wherein:
the buried deep trench isolation structure is formed below the channel region of the gates and about the photosensitive region; and
the buried deep trench isolation structure extends into a P-epi substrate and a P+ substrate.

* * * * *